United States Patent

Yoshitani

(10) Patent No.: US 9,654,114 B2
(45) Date of Patent: May 16, 2017

(54) TRANSMISSION CIRCUIT, INTEGRATED CIRCUIT, AND PARALLEL-TO-SERIAL CONVERSION METHOD

(71) Applicant: SOCIONEXT INC., Yokohama-shi, Kanagawa (JP)

(72) Inventor: Masanori Yoshitani, Hachioji (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/854,961

(22) Filed: Sep. 15, 2015

(65) Prior Publication Data

US 2016/0099717 A1 Apr. 7, 2016

(30) Foreign Application Priority Data

Oct. 6, 2014 (JP) .................. 2014-205663

(51) Int. Cl.
*H03L 7/00* (2006.01)
*H03M 9/00* (2006.01)
*G11C 19/34* (2006.01)
*G11C 19/00* (2006.01)
*G11C 19/28* (2006.01)

(52) U.S. Cl.
CPC ............. *H03L 7/00* (2013.01); *G11C 19/00* (2013.01); *G11C 19/28* (2013.01); *H03M 9/00* (2013.01); *G11C 19/34* (2013.01)

(58) Field of Classification Search
CPC .. G06F 1/00; G06F 1/10; G11C 19/00; G11C 19/28; G11C 19/34; G11C 7/00; G11C 7/22; H03K 5/00; H03K 5/135; H03L 7/00; H03L 7/0812; H03M 9/00

USPC .......................................................... 327/141
See application file for complete search history.

(56) References Cited

U.S. PATENT DOCUMENTS

| 2004/0123190 A1 | 6/2004 | Toyoda et al. |
| 2006/0192701 A1* | 8/2006 | Kobayashi ............. H03M 9/00 341/101 |
| 2007/0013450 A1* | 1/2007 | Lin ........................ H03L 7/089 331/16 |
| 2007/0047667 A1 | 3/2007 | Shumarayev |

(Continued)

FOREIGN PATENT DOCUMENTS

| JP | 61-245731 A | 11/1986 |
| JP | 09-149015 A | 6/1997 |

(Continued)

*Primary Examiner* — Lincoln Donovan
*Assistant Examiner* — David Mattison
(74) *Attorney, Agent, or Firm* — Arent Fox LLP

(57) ABSTRACT

A transmission circuit includes: a shift register configured to shift, in synchronization with a first clock signal, input parallel data within a plurality of flip-flop circuits; a control circuit configured to output a second clock signal of a phase in accordance with a phase of the first clock signal; a selector configured to select any one of the input parallel data and pieces of output parallel data of the plurality of flip-flop circuits; and a conversion circuit configured to convert, in synchronization with the second clock signal, the parallel data selected by the selector into pieces of serial data, in which the control circuit outputs a selection signal to the selector, in accordance with a deviation amount of the detected phase of the first clock signal.

12 Claims, 6 Drawing Sheets

(56) References Cited

U.S. PATENT DOCUMENTS

| | | | |
|---|---|---|---|
| 2009/0220038 A1* | 9/2009 | Valero-Lopez | H03K 5/131 375/362 |
| 2011/0063144 A1* | 3/2011 | Takada | H03M 9/00 341/101 |
| 2012/0033748 A1 | 2/2012 | Shimomura | |
| 2012/0313799 A1 | 12/2012 | Koyanagi | |

FOREIGN PATENT DOCUMENTS

| JP | 10-190639 A | 7/1998 |
|---|---|---|
| JP | 2004-193817 A | 7/2004 |
| JP | 2006-060507 A | 3/2006 |
| JP | 2007-060645 A | 3/2007 |
| JP | 2008-172657 A | 7/2008 |
| JP | 2012-039448 A | 2/2012 |
| JP | 2012-257047 A | 12/2012 |

\* cited by examiner

TRANSMISSION CIRCUIT, INTEGRATED CIRCUIT, AND PARALLEL-TO-SERIAL CONVERSION METHOD

CROSS-REFERENCE TO RELATED APPLICATION

This application is based upon and claims the benefit of priority of the prior Japanese Patent Application No. 2014-205663, filed on Oct. 6, 2014, the entire contents of which are incorporated herein by reference.

FIELD

The embodiments discussed herein are directed to a transmission circuit, an integrated circuit, and a parallel-to-serial conversion method.

BACKGROUND

There is known a clock transfer circuit having a serial shift register which serially writes reception data in accordance with a write clock of n-th power (n≠0) of 2 of a transfer clock, and outputs the data in parallel (refer to Patent Document 1). A clock generator generates the write clock and the transfer clock for transferring the reception data. A deviation detecting unit detects a deviation of phase difference between a reception and reproduction clock generated based on the reception data and the transfer clock. A selection circuit determines, based on the deviation of the phase difference detected by the deviation detecting unit, a selection position of data selected from a data sequence output from the serial shift register. A flip-flop outputs the data selected by the selection circuit in synchronization with the transfer clock. The clock transfer circuit transfers the reception data by transferring the data onto a stable clock.

Further, there is known a synchronization correction circuit of a loop transmitter in which it is designed such that each station individually generates a transmission clock with the same frequency, and a relay operation is conducted by converting a reception signal into a transmission signal in synchronization with the transmission clock (refer to Patent Document 2). A variable delay circuit delays the reception signal for a variable period of time. A phase difference detecting circuit detects a phase difference between an output of the variable delay circuit and the transmission clock. A setting unit sets the variable period of time of the variable delay circuit based on the phase difference.

Further, there is known a clock phase adjusting circuit used when acquiring input data of a predetermined cycle in accordance with a timing of a clock signal of a cycle same as the predetermined cycle (refer to Patent Document 3). A phase control unit controls a phase of the clock signal in accordance with a control signal. An out-of-synchronization detecting unit detects, based on a clock signal after being subjected to the phase adjustment by the phase control unit and the input data, an out-of-synchronization state of the input data with respect to the phase-adjusted clock signal. A pulse generating unit generates pulses at regular periods, during a period of time in which the out-of-synchronization state is detected by the out-of-synchronization detecting unit. A control signal generating unit generates a control signal in accordance with a number of generation of the pulses.

Patent Document 1: Japanese Laid-open Patent Publication No. 10-190639

Patent Document 2: Japanese Laid-open Patent Publication No. 61-245731

Patent Document 3: Japanese Laid-open Patent Publication No. 09-149015

A jitter is a fluctuation of phase in a time axis direction of a digital signal. In particular, a low-frequency jitter is called as wander. If a first-in-first-out (FIFO) circuit for performing buffering of data is used for absorbing the wander of clock signal, a configuration for performing a write control and a read control of the FIFO circuit becomes complicated, resulting in that an area of the entire integrated circuit is increased.

SUMMARY

A transmission circuit includes: a shift register configured to include a plurality of flip-flop circuits which are cascade-connected, and to shift, in synchronization with a first clock signal, input parallel data within the plurality of flip-flop circuits; a control circuit configured to detect a phase of the first clock signal, and to output a second clock signal of a phase in accordance with the detected phase of the first clock signal; a selector configured to select any one of the input parallel data and pieces of output parallel data of the plurality of flip-flop circuits; and a conversion circuit configured to convert, in synchronization with the second clock signal, the parallel data selected by the selector into pieces of serial data, in which the control circuit outputs a selection signal in accordance with a deviation amount of the detected phase of the first clock signal, and the selector selects, in accordance with the selection signal, any one of the input parallel data and the pieces of output parallel data of the plurality of flip-flop circuits.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
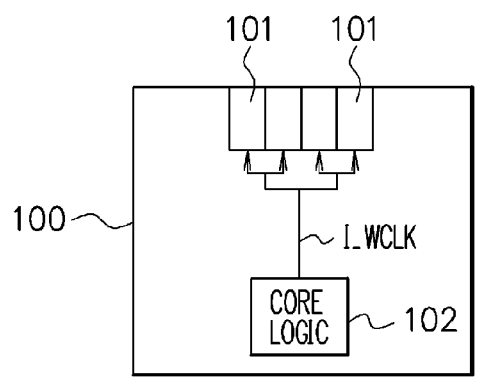
FIG. 1 is a diagram illustrating a configuration example of an integrated circuit according to the present embodiment.

FIG. 1 is a diagram illustrating a configuration example of an integrated circuit 100 according to the present embodiment. The integrated circuit 100 is used for a server or a high-speed communication apparatus, for example. The integrated circuit 100 has a plurality of transmission circuits 101 and a core logic circuit 102. The core logic circuit 102 outputs a first clock signal I_WCLK to the plurality of transmission circuits 101. Further, the core logic circuit 102 outputs different data synchronized with the first clock signal I_WCLK to the plurality of transmission circuits 101. Each of the plurality of transmission circuits 101 transmits data to a reception circuit based on the first clock signal I_WCLK. The plurality of transmission circuits 101 perform skew adjustment to mutually match the transmission timing of data.

Figure 2:
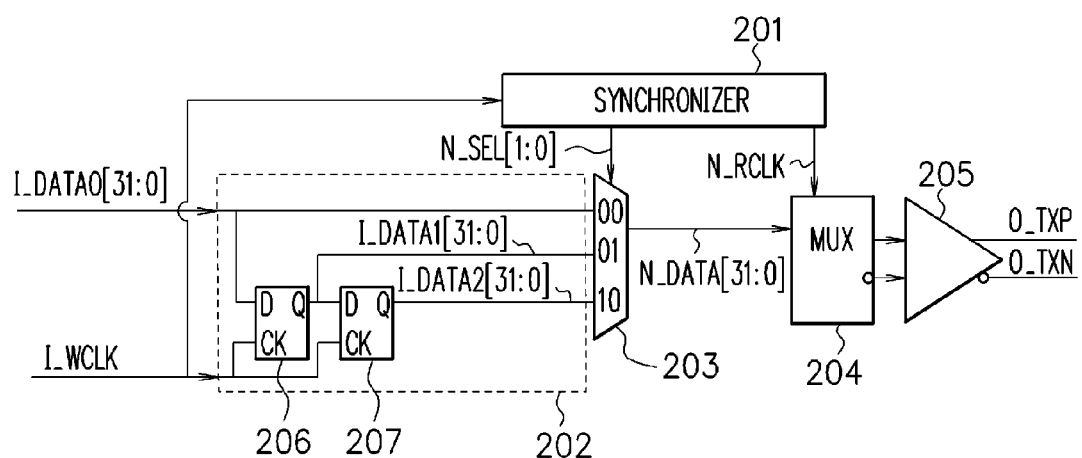
FIG. 2 is a diagram illustrating a configuration example of a transmission circuit.
Figure 7:
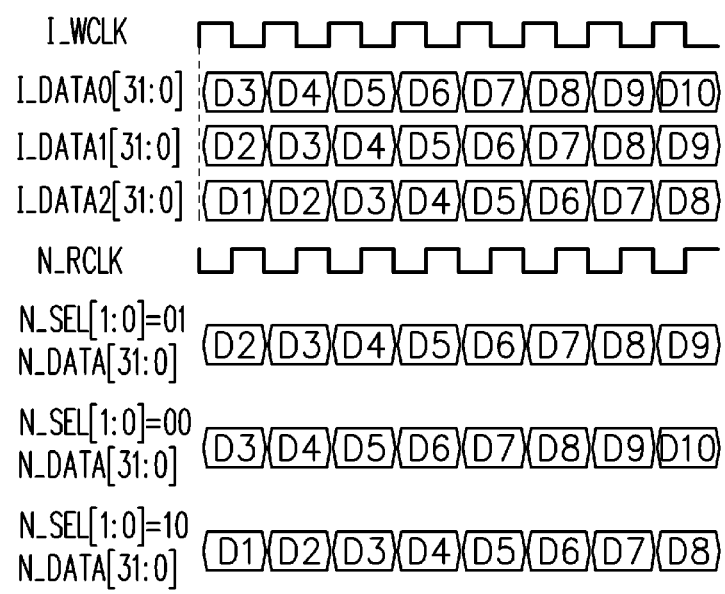
FIG. 7 is a timing chart illustrating an operation example of the transmission circuit.

FIG. 2 is a diagram illustrating a configuration example of the transmission circuit 101, and FIG. 7 is a timing chart illustrating an operation example of the transmission circuit 101. The transmission circuit 101 has a synchronizer 201, a shift register 202, a selector 203, a multiplexer 204, and a driver 205. The transmission circuit 101 makes 32-bit parallel data I_DATA0[31:0] and the first clock signal I_WCLK input therein from the core logic circuit 102 in FIG. 1.

The shift register 202 has a first flip-flop circuit 206 and a second flip-flop circuit 207 which are cascade-connected. In synchronization with a rising edge of the first clock signal I_WCLK, the first flip-flop circuit 206 holds the parallel data I_DATA0[31:0], and outputs the held parallel data as 32-bit parallel data I_DATA1[31:0]. In synchronization with the rising edge of the first clock signal I_WCLK, the second flip-flop circuit 207 holds the parallel data I_DATA1[31:0], and outputs the held parallel data as 32-bit parallel data I_DATA2[31:0]. In synchronization with the first clock signal I_WCLK, the shift register 202 shifts the parallel data I_DATA0[31:0] within the first flip-flop circuit 206 and the second flip-flop circuit 207.

The synchronizer 201 being a synchronization circuit (control circuit), detects a phase of the first clock signal I_WCLK, and outputs a second clock signal N_RCLK having a phase in accordance with the detected phase of the first clock signal I_WCLK, to the multiplexer 204. Further, the synchronizer 201 calculates, based on an integrated value of a phase difference between the first clock signal I_WCLK detected last time and the first clock signal I_WCLK detected this time, a deviation amount of the detected phase of the first clock signal I_WCLK, and outputs a 2-bit selection signal N_SEL[1:0], in accordance with the calculated deviation amount of the phase of the first clock signal I_WCLK. A configuration of the synchronizer 201 will be described later while referring to FIG. 3 to FIG. 6.

The selector 203 selects, in accordance with the selection signal N_SEL[1:0], any one of the input parallel data I_DATA0[31:0], the parallel data I_DATA1[31:0] output by the first flip-flop circuit 206, and the parallel data I_DATA2[31:0] output by the second flip-flop circuit 207, and outputs the selected parallel data, as 32-bit parallel data N_DATA[31:0], to the multiplexer 204.

Concretely, when the selection signal N_SEL[1:0] is "00", the selector 203 outputs the parallel data I_DATA0[31:0] as the parallel data N_DATA[31:0]. Further, when the selection signal N_SEL[1:0] is "01", the selector 203 outputs the parallel data I_DATA1[31:0] as the parallel data N_DATA[31:0]. Further, when the selection signal N_SEL[1:0] is "10", the selector 203 outputs the parallel data I_DATA2[31:0] as the parallel data N_DATA[31:0].

The multiplexer 204 being a conversion circuit, converts the parallel data N_DATA[31:0] selected by the selector 203 into pieces of serial data in synchronization with the second clock signal N_RCLK, and outputs pieces of differential serial data to the driver 205. The driver 205 being a differential amplifier, amplifies the pieces of differential serial data, and outputs the amplified pieces of differential serial data O_TXP and O_TXN.

The first clock signal I_WCLK is a clock signal generated by the core logic circuit 102. The second clock signal N_RCLK is a clock signal generated by the transmission circuit 101, and is a clock signal having a frequency same as a frequency of the first clock signal I_WCLK, and which is asynchronous with respect to the first clock signal I_WCLK. For this reason, the transmission circuit 101 performs transfer of data from the first clock signal I_WCLK to the second clock signal N_RCLK. Specifically, the transmission circuit 101 converts the parallel data I_DATA0[31:0] synchronized with the first clock signal I_WCLK into the pieces of serial data O_TXP and O_TXN synchronized with the second clock signal N_RCLK.

Figure 3:
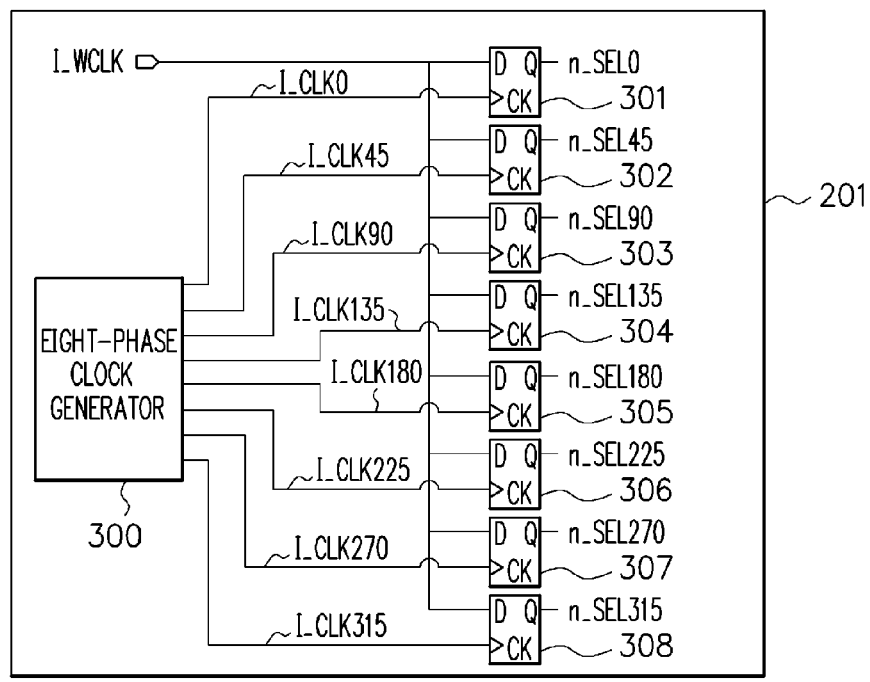
FIG. 3 is a diagram illustrating a configuration example of a part of a synchronizer.
Figure 4:
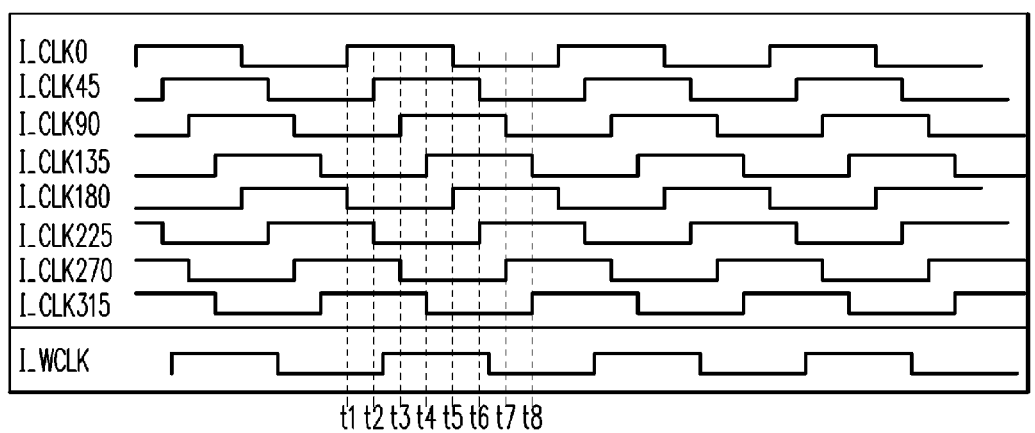
FIG. 4 is a timing chart illustrating an operation example of the synchronizer.

FIG. 3 is a diagram illustrating a configuration example of a part of the synchronizer 201, and FIG. 4 is a timing chart illustrating an operation example of the synchronizer 201. The synchronizer 201 has an eight-phase clock generator 300 and eight third flip-flop circuits 301 to 308. The eight-phase clock generator 300 outputs reference clock signals I_CLK0 to I_CLK315 of eight phases. The reference clock signal I_CLK0 is a clock signal of a phase of 0°. The reference clock signal I_CLK45 is a clock signal of a phase of 45°. The reference clock signal I_CLK90 is a clock signal of a phase of 90°. The reference clock signal I_CLK135 is a clock signal of a phase of 135°. The reference clock signal I_CLK180 is a clock signal of a phase of 180°. The reference clock signal I_CLK225 is a clock signal of a phase of 225°. The reference clock signal I_CLK270 is a clock signal of a phase of 270°. The reference clock signal I_CLK315 is a clock signal of a phase of 315°.

At a time t1 and the like, the third flip-flop circuit 301 holds a value of the first clock signal I_WCLK ("0" of low level, for example) in synchronization with a rising edge of the reference clock signal I_CLK0, and outputs the held value n_SEL0.

At a time t2 and the like, the third flip-flop circuit 302 holds a value of the first clock signal I_WCLK ("0" of low level, for example) in synchronization with a rising edge of the reference clock signal I_CLK45, and outputs the held value n_SEL45.

At a time t3 and the like, the third flip-flop circuit 303 holds a value of the first clock signal I_WCLK ("1" of high level, for example) in synchronization with a rising edge of the reference clock signal I_CLK90, and outputs the held value n_SEL90.

At a time t4 and the like, the third flip-flop circuit 304 holds a value of the first clock signal I_WCLK ("1" of high level, for example) in synchronization with a rising edge of the reference clock signal I_CLK135, and outputs the held value n_SEL135.

At a time t5 and the like, the third flip-flop circuit 305 holds a value of the first clock signal I_WCLK ("1" of high level, for example) in synchronization with a rising edge of the reference clock signal I_CLK180, and outputs the held value n_SEL180.

At a time t6 and the like, the third flip-flop circuit 306 holds a value of the first clock signal I_WCLK ("1" of high level, for example) in synchronization with a rising edge of the reference clock signal I_CLK225, and outputs the held value n_SEL225.

At a time t7 and the like, the third flip-flop circuit 307 holds a value of the first clock signal I_WCLK ("0" of low level, for example) in synchronization with a rising edge of the reference clock signal I_CLK270, and outputs the held value n_SEL270.

At a time t8 and the like, the third flip-flop circuit 308 holds a value of the first clock signal I_WCLK ("0" of low level, for example) in synchronization with a rising edge of the reference clock signal I_CLK315, and outputs the held value n_SEL315.

Figure 5:
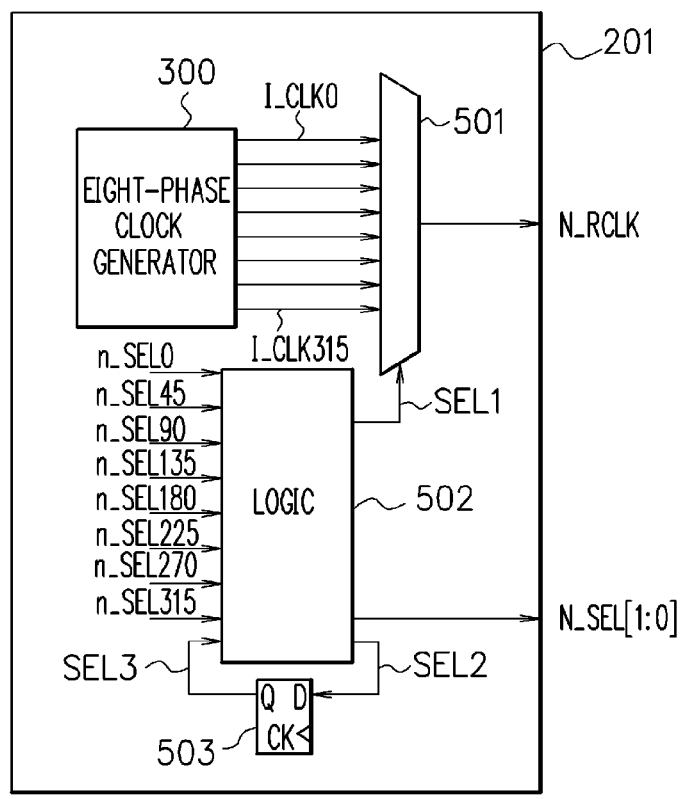
FIG. 5 is a diagram illustrating another configuration example of a part of the synchronizer.

FIG. 5 is a diagram illustrating another configuration example of a part of the synchronizer 201. The synchronizer 201 has, in addition to the eight-phase clock generator 300 and the third flip-flop circuits 301 to 308, a selector 501, a logic circuit 502, and a fourth flip-flop circuit 503. The logic circuit 502 outputs, based on the eight values n_SEL0 to n_SEL315, a selection signal SEL1 to the selector 501. The selector 501 selects, in accordance with the selection signal SEL1, any one of the eight reference clock signals I_CLK0 to I_CLK315 output by the eight-phase clock generator 300, and outputs the selected reference clock signal as the second clock signal N_RCLK.

For example, during the time t1 to the time t8 in FIG. 4, the value n_SEL0 at the time t1 is "0", the value n_SEL45 at the time t2 is "0", the value n_SEL90 at the time t3 is "1", the value n_SEL135 at the time t4 is "1", the value n_SEL180 at the time t5 is "1", the value n_SEL225 at the time t6 is "1", the value n_SEL270 at the time t7 is "0", and the value n_SEL315 at the time t8 is "0". The logic circuit 502 detects a position at which the value changes from "0" to "1", in an order from the value n_SEL0 to the value n_SEL315, and detects that there exists the rising edge of the first clock signal I_WCLK at the detected position. For example, the logic circuit 502 detects that there exists the rising edge of the first clock signal I_WCLK at a position between "0" being the value n_SEL45 at the time t2 and "1" being the value n_SEL90 at the time t3, and outputs the selection signal SEL1 for selecting, among the reference clock signals I_CLK0 to I_CLK315 of eight phases, the reference clock signal I_CLK90 (or I_CLK45) having the phase closest to the phase of the first clock signal I_WCLK. In that case, the selector 501 selects the reference clock signal I_CLK90 (or I_CLK45) in accordance with the selection signal SEL1, and outputs the reference clock signal I_CLK90 (or I_CLK45) as the second clock signal N_RCLK.

As described above, the synchronizer 201 detects, in accordance with the output values n_SEL0 to n_SEL315 of the third flip-flop circuits 301 to 308, the phase of the first clock signal I_WCLK. Further, the synchronizer 201 selects the reference clock signal of any one of the phases out of the reference clock signals I_CLK0 to I_CLK315 of eight phases, in accordance with the detected phase of the first clock signal I_WCLK, and outputs the selected reference clock signal as the second clock signal N_RCLK.

The fourth flip-flop circuit 503 holds a selection signal SEL2 output this time by the logic circuit 502, and outputs the held selection signal to the logic circuit 502 as a selection signal SEL3 output last time. The selection signal SEL2 corresponds to the selection signal SEL1. The selection signal SEL2 is a signal which changes with time, and the selection signal SEL1 is a signal which does not change if once it is selected. In order to absorb a wander of the first clock signal I_WCLK, the logic circuit 502 outputs the selection signal N_SEL[1:0], based on the selection signal SEL3 output last time and the selection signal SEL2 output this time. Details thereof will be described later while referring to FIG. 6.

Figure 6:
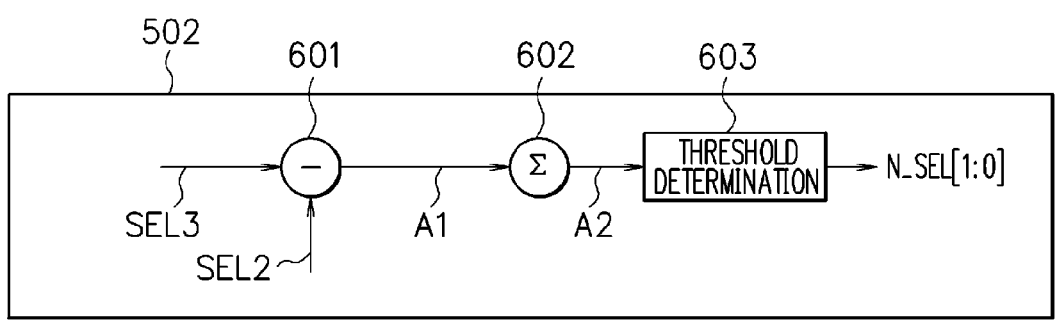
FIG. 6 is a diagram illustrating a configuration example of a part of a logic circuit.

FIG. 6 is a diagram illustrating a configuration example of a part of the logic circuit 502. The logic circuit 502 has a subtracter 601, an integrator 602, and a threshold determination part 603. The subtracter 601 subtracts the selection signal SEL2 output this time from the selection signal SEL3 output last time, to thereby output a difference signal A1. The integrator 602 integrates the difference signal A1, to thereby output an integrated value A2. The integrated value A2 corresponds to a phase deviation amount of the first clock signal I_WCLK. Further, regarding the integrated value A2, a positive value indicates a lagging phase, and a negative value indicates a leading phase, for example.

When the integrated value A2 indicates a phase which leads a first threshold phase, namely, when the phase deviation amount of the first clock signal I_WCLK is larger than the first threshold phase in a leading direction of the phase, the threshold determination part 603 outputs "10", as the selection signal N_SEL[1:0]. The first threshold phase (absolute value) corresponds to a phase of a half cycle of the reference clock signals I_CLK0 to I_CLK315, for example. As illustrated in FIG. 7, when the selection signal N_SEL[1:0] is "10", the selector 203 in FIG. 2 selects the parallel data I_DATA2[31:0] output by the second flip-flop circuit 207, and outputs the parallel data I_DATA2[31:0] as the parallel data N_DATA[31:0].

Further, when the integrated value A2 indicates a phase which lags behind a second threshold phase, namely, when the phase deviation amount of the first clock signal I_WCLK is larger than the second threshold phase in a lagging direction of the phase, the threshold determination part 603 outputs "00", as the selection signal N_SEL[1:0]. The second threshold phase (absolute value) corresponds to a phase of a half cycle of the reference clock signals I_CLK0 to I_CLK315, for example. As illustrated in FIG. 7, when the selection signal N_SEL[1:0] is "00", the selector 203 in FIG. 2 selects the input parallel data I_DATA0[31:0], and outputs the input parallel data I_DATA0[31:0] as the parallel data N_DATA[31:0].

Further, when the integrated value A2 indicates a phase which does not lead the first threshold phase, and which does not lag behind the second threshold phase, the threshold determination part 603 outputs "01" as the selection signal N_SEL[1:0]. As illustrated in FIG. 7, when the selection signal N_SEL[1:0] is "01", the selector 203 in FIG. 2 selects the parallel data I_DATA1[31:0] output by the first flip-flop circuit 206, and outputs the parallel data I_DATA1[31:0] as the parallel data N_DATA[31:0].

Due to the wander of the first clock signal I_WCLK, the phase of the first clock signal I_WCLK changes over a long cycle, and thus the selection signal SEL1 in FIG. 5 changes. The synchronizer 201 detects, based on the selection signals SEL2 and SEL3, the phase deviation amount of the first clock signal I_WCLK, and outputs the selection signal N_SEL[1:0] to the selector 203. Accordingly, the shift register 202 and the selector 203 can absorb the wander of the first clock signal I_WCLK. As a result of this, the multiplexer 204 can appropriately convert the parallel data N_DATA[31:0] into the pieces of serial data.

Further, the multiplexer 204 can convert the parallel data N_DATA[31:0] into the pieces of serial data in synchronization with the second clock signal N_RCLK, so that the plurality of transmission circuits 101 in FIG. 1 can transmit the pieces of serial data at the same timing.

Note that the shift register 202 may also be formed of three or more of flip-flop circuits. In that case, the selector 203 selects, in accordance with the integrated value A2 indicating the phase deviation amount of the first clock signal I_WCLK, any one of pieces of output parallel data of the three or more of flip-flop circuits, and the input parallel data I_DATA0[31:0], and outputs the parallel data N_DATA [31:0].

Figure 8:
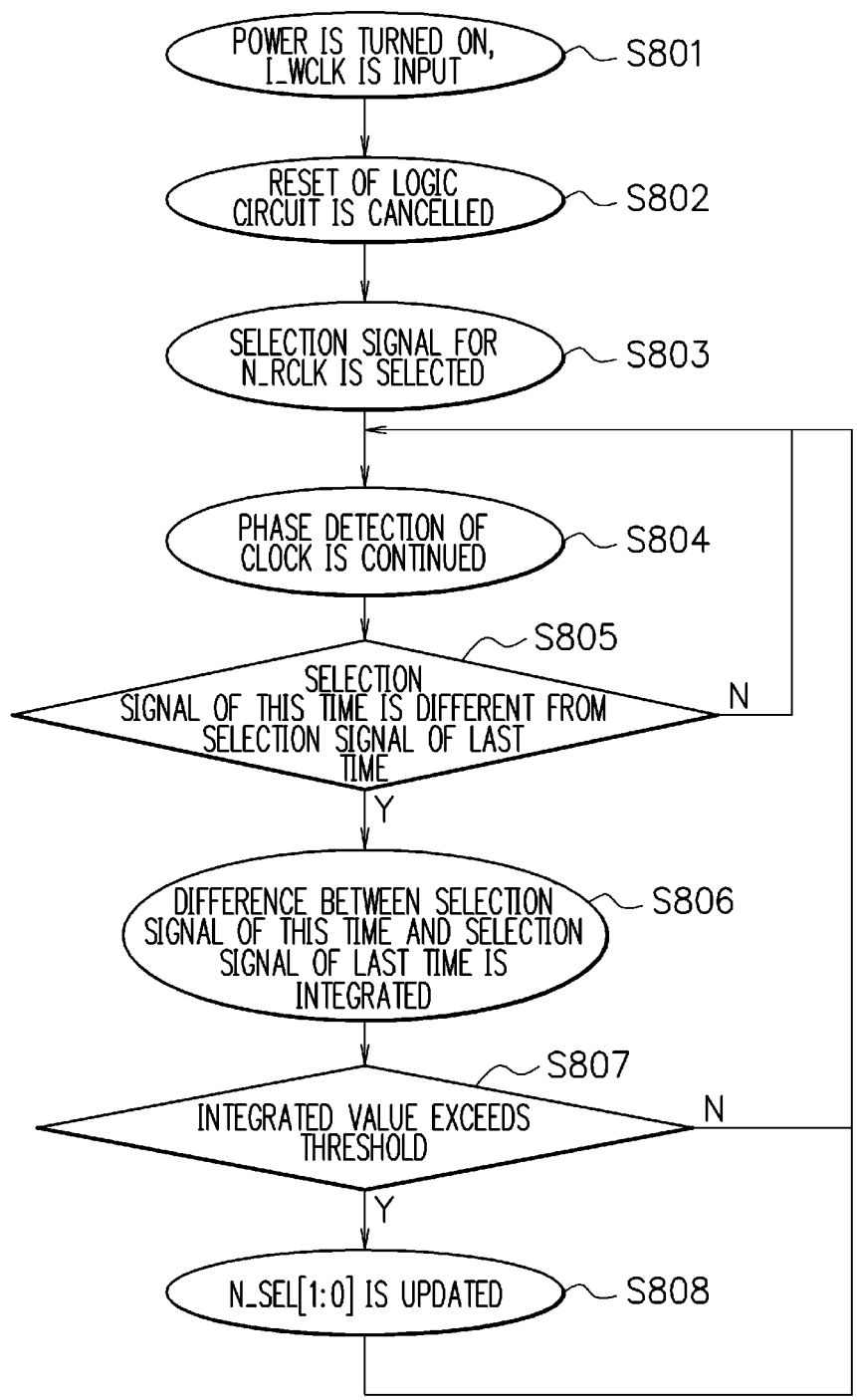
FIG. 8 is a flow chart illustrating a processing method of the integrated circuit.

FIG. 8 is a flow chart illustrating a processing method of the integrated circuit 100. In step S801, when a power source of the integrated circuit 100 is turned on, the transmission circuit 101 makes the first clock signal I_WCLK input therein from the core logic circuit 102. Next, in step S802, the transmission circuit 101 cancels a reset of the logic circuit 502. Next, in step S803, the logic circuit 502 selects and outputs the selection signal SEL1 for selecting the second clock signal N_RCLK. Next, in step S804, the logic circuit 502 continues the phase detection of the first clock signal I_WCLK based on the values n_SEL0 to n_SEL315, and outputs the selection signal SEL1.

Next, in step S805, the logic circuit 502 checks whether or not the selection signal SEL2 output this time is different from the selection signal SEL3 output last time. When the both signals are different from each other, the process proceeds to step S806, and when the both signals are the same, the process returns to step S804.

In step S806, the subtracter 601 subtracts the selection signal SEL2 output this time from the selection signal SEL3 output last time, to thereby output the difference signal A1. The integrator 602 integrates the difference signal A1, to thereby output the integrated value A2.

Next, in step S807, the threshold determination part 603 compares the integrated value A2 and the threshold phases. When the integrated value A2 indicates the phase which leads the first threshold phase, or when the integrated value A2 indicates the phase which lags behind the second threshold phase, the process proceeds to step S808. When the integrated value A2 indicates the phase between the first threshold phase and the second threshold phase, the threshold determination part 603 sets the selection signal N_SEL [1:0] to "01", and the process returns to step S804.

In step S808, the threshold determination part 603 sets the selection signal N_SEL[1:0] to "10" when the integrated value A2 indicates the phase which leads the first threshold phase, and sets the selection signal N_SEL[1:0] to "00" when the integrated value A2 indicates the phase which lags behind the second threshold phase. At this time, the reset of the integrated value A2 is not conducted. After that, the process returns to step S804.

Figure 9:
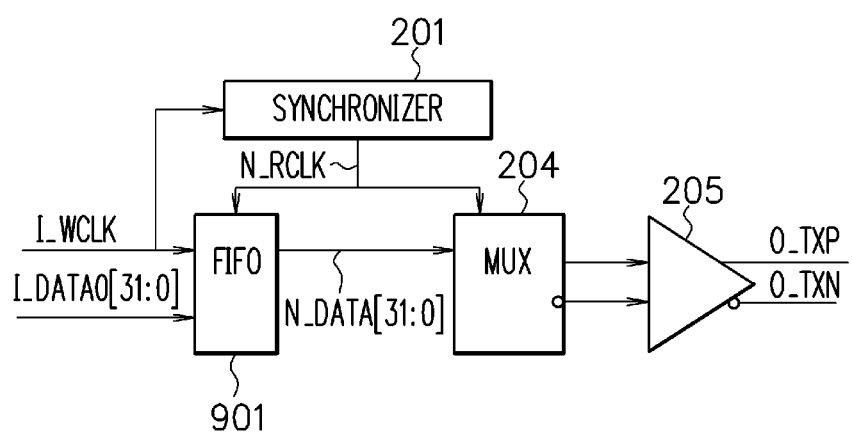
FIG. 9 is a diagram illustrating a configuration example of a transmission circuit which uses a FIFO circuit.

FIG. 9 is a diagram illustrating a configuration example of a transmission circuit which uses a FIFO circuit 901. The transmission circuit in FIG. 9 corresponds to the transmission circuit 101 in FIG. 2 in which the FIFO circuit 901 is provided in place of the shift register 202 and the selector 203. The synchronizer 201 does not generate the selection signal N_SEL[1:0], and generates only the second clock signal N_RCLK. The FIFO circuit 901 writes the parallel data I_DATA0[31:0] in synchronization with the first clock signal I_WCLK, and reads the parallel data N_DATA[31:0] in synchronization with the second clock signal N_RCLK. By using the FIFO circuit 901, the wander of the first clock signal I_WCLK is absorbed. However, a configuration of the FIFO circuit 901 for performing a control of write pointer (address), a control of read pointer (address) and the like is complicated, so that an area of the transmission circuit is increased, resulting in that a power consumption is increased.

On the contrary, the transmission circuit 101 in FIG. 2 in the present embodiment uses the shift register 202 and the selector 203, in place of the FIFO circuit 901. The selector 203 performs a simple control such that, in accordance with the selection signal N_SEL[1:0], any one of the three pieces of parallel data I_DATA0[31:0], I_DATA1[31:0], and I_DATA2[31:0] is selected. Accordingly, the configuration of the transmission circuit 101 in FIG. 2 is simpler than the configuration of the transmission circuit in FIG. 9, and thus an area of the transmission circuit 101 can be reduced. As a result of this, in the present embodiment, it is possible to reduce an area of the integrated circuit 100 including the transmission circuits 101 in FIG. 2. Further, the transmission circuit 101 and the integrated circuit 100 in the present embodiment can reduce the power consumption.

By using the shift register and the selector, it is possible to absorb the wander of the first clock signal with a simple configuration, so that the area of the transmission circuit can be reduced.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmission circuit, comprising:
   a shift register configured to include a plurality of flip-flop circuits which are cascade-connected, and to shift, in synchronization with a first clock signal, input parallel data set within the plurality of flip-flop circuits;
   a control circuit configured to detect a phase of the first clock signal, and to output a second clock signal of a phase in accordance with the detected phase of the first clock signal;
   a selector configured to select any one of the input parallel data set and a plurality of output parallel data sets, each of the plurality of output parallel data sets being held by a corresponding one of the plurality of flip-flop circuits; and
   a conversion circuit configured to convert, in synchronization with the second clock signal, the parallel data set selected by the selector into pieces of serial data, wherein:
   the control circuit outputs a selection signal in accordance with a deviation amount of the detected phase of the first clock signal; and
   the selector selects, in accordance with the selection signal, any one of the input parallel data set and the plurality of output parallel data sets.

2. The transmission circuit according to claim 1, wherein:
   the shift register includes:
   a first flip-flop circuit which holds the input parallel data set in synchronization with the first clock signal; and
   a second flip-flop circuit which holds output parallel data set of the first flip-flop circuit in synchronization with the first clock signal; and the selector selects, in accordance with the selection signal, any one of the input parallel data set, the output parallel data set of the first flip-flop circuit, and output parallel data set of the second flip-flop circuit.

3. The transmission circuit according to claim 2, wherein the control circuit calculates the deviation amount of the detected phase of the first clock signal based on an integrated value of a phase difference between the first clock signal detected at a previous instance of time and the first clock signal detected at a current instance of time, wherein:
when the integrated value indicates a phase which leads a first threshold phase, the control circuit outputs the selection signal for selecting the output parallel data set of the second flip-flop circuit;
when the integrated value indicates a phase which lags behind a second threshold phase, the control circuit outputs the selection signal for selecting the input parallel data set; and
when the integrated value indicates a phase which does not lead the first threshold phase, and which does not lag behind the second threshold phase, the control circuit outputs the selection signal for selecting the output parallel data set of the first flip-flop circuit.

4. The transmission circuit according to claim 1, wherein the control circuit selects and outputs, out of reference clock signals of a plurality of phases, a reference clock signal of any one of the plurality of phases as the second clock signal, in accordance with the detected phase of the first clock signal.

5. The transmission circuit according to claim 4, wherein the control circuit includes a plurality of third flip-flop circuits which hold values of the first clock signal in synchronization with the reference clock signals of the plurality of phases, and detects the phase of the first clock signal in accordance with output values of the plurality of third flip-flop circuits.

6. An integrated circuit, comprising:
a logic circuit configured to output a first clock signal and input parallel data set; and
a transmission circuit configured to receive the first clock signal and the input parallel data set, wherein
the transmission circuit includes:
a shift register which includes a plurality of flip-flop circuits which are cascade-connected, and shifts, in synchronization with the first clock signal, the input parallel data set within the plurality of flip-flop circuits;
a control circuit which detects a phase of the first clock signal, and outputs a second clock signal of a phase in accordance with the detected phase of the first clock signal;
a selector which selects any one of the input parallel data set and a plurality of output parallel data sets, each of the plurality of output parallel data sets being held by a corresponding one of the plurality of flip-flop circuits; and
a conversion circuit which converts, in synchronization with the second clock signal, the parallel data set selected by the selector into pieces of serial data, wherein:
the control circuit outputs a selection signal in accordance with a deviation amount of the detected phase of the first clock signal; and
the selector selects, in accordance with the selection signal, any one of the input parallel data set and the plurality of output parallel data sets.

7. The integrated circuit according to claim 6, wherein:
the shift register includes:
a first flip-flop circuit which holds the input parallel data set in synchronization with the first clock signal; and
a second flip-flop circuit which holds output parallel data set of the first flip-flop circuit in synchronization with the first clock signal; and
the selector selects, in accordance with the selection signal, any one of the input parallel data set, the output parallel data set of the first flip-flop circuit, and output parallel data set of the second flip-flop circuit.

8. The integrated circuit according to claim 7, wherein the control circuit calculates the deviation amount of the detected phase of the first clock signal based on an integrated value of a phase difference between the first clock signal detected at a previous instance of time and the first clock signal detected at a current instance of time, wherein:
when the integrated value indicates a phase which leads a first threshold phase, the control circuit outputs the selection signal for selecting the output parallel data set of the second flip-flop circuit;
when the integrated value indicates a phase which lags behind a second threshold phase, the control circuit outputs the selection signal for selecting the input parallel data set; and
when the integrated value indicates a phase which does not lead the first threshold phase, and which does not lag behind the second threshold phase, the control circuit outputs the selection signal for selecting the output parallel data set of the first flip-flop circuit.

9. The integrated circuit according to claim 6, wherein the control circuit selects and outputs, out of reference clock signals of a plurality of phases, a reference clock signal of any one of the plurality of phases as the second clock signal, in accordance with the detected phase of the first clock signal.

10. The integrated circuit according to claim 9, wherein the control circuit includes a plurality of third flip-flop circuits which hold values of the first clock signal in synchronization with the reference clock signals of the plurality of phases, and detects the phase of the first clock signal in accordance with output values of the plurality of third flip-flop circuits.

11. A parallel-to-serial conversion method, comprising:
shifting input parallel data set within a plurality of flip-flop circuits in synchronization with a first clock signal;
detecting a phase of the first clock signal and outputting a second clock signal of a phase in accordance with the detected phase of the first clock signal by using a control circuit;
selecting, by using a selector, any one of the input parallel data set and a plurality of output parallel data sets, each of the plurality of output parallel data sets being held by a corresponding one of the plurality of flip-flop circuits;
converting, by using a conversion circuit, the parallel data set selected by the selector into pieces of serial data, in synchronization with the second clock signal;
outputting, by using the control circuit, a selection signal in accordance with a deviation amount of the detected phase of the first clock signal; and
selecting, by using the selector, any one of the input parallel data set and the plurality of output parallel data sets, in accordance with the selection signal.

12. The parallel-to-serial conversion method according to claim 11, further comprising calculating, by using the control circuit, the deviation amount of the detected phase of the first clock signal, based on an integrated value of a phase difference between the first clock signal detected at a pervious instance of time and the first clock signal detected at a current instance of time.

* * * * *